United States Patent [19]
Itoh

[11] Patent Number: 5,955,727
[45] Date of Patent: Sep. 21, 1999

[54] OPTICAL ENCODER HAVING A SHADE LAYER MADE FROM PHOTOSENSITIVE MATERIAL

[75] Inventor: Yoshinori Itoh, Nagano-ken, Japan

[73] Assignee: Harmonic Drive Systems, Inc., Tokyo, Japan

[21] Appl. No.: 08/923,400

[22] Filed: Sep. 4, 1997

[30] Foreign Application Priority Data

Sep. 10, 1996 [JP] Japan .................................. 8-239016

[51] Int. Cl.$^6$ ............................ H01J 40/14; G01B 11/14
[52] U.S. Cl. ............................. 250/231.13; 250/237 G; 356/373
[58] Field of Search ................... 250/231.13–231.18, 250/237 G; 356/373, 374; 341/13, 31

[56] References Cited

U.S. PATENT DOCUMENTS

| | | |
|---|---|---|
| 4,799,798 | 1/1989 | Erb ....................................... 250/237 G |
| 5,026,164 | 6/1991 | Ichikawa .............................. 250/237 G |
| 5,067,816 | 11/1991 | Ichikawa .............................. 250/237 G |

FOREIGN PATENT DOCUMENTS

| | | |
|---|---|---|
| 401059011 | 3/1989 | Japan . |
| 405332792 | 12/1993 | Japan . |
| 002033576 | 3/1980 | United Kingdom . |

*Primary Examiner*—Stephone Allen
*Attorney, Agent, or Firm*—Burns, Doane, Swecker & Mathis LLP

[57] ABSTRACT

A shade layer 35 made from photosensitive material is formed on a surface of a rotational slit disk 3 of an optical encoder 1, and a slit pattern 36 is formed in the shade layer 35. This shade layer 35 is covered with and protected by a protective layer 39 made from such materials as acrylic resin. Accordingly, the slit pattern 36 can be prevented from being touched and damaged by other members. Further, the slit pattern can be prevented from being deteriorated by air. In addition, by giving an appropriate optical property to the protective layer, it is possible to make the optical property of the surface of the rotational slit disk appropriate.

7 Claims, 3 Drawing Sheets

OPTICAL ENCODER HAVING A SHADE LAYER MADE FROM PHOTOSENSITIVE MATERIAL

BACKGROUND OF THE INVENTION

FIELD OF THE INVENTION

This invention relates to an optical encoder used for detecting the rotational position, rotational speed and the like of a motor shaft, and the moving position, moving speed and the like of a linearly-reciprocating member. More particularly, this invention relates to a rotational slit disk or a movable slit plate as a component part of an optical encoder having a slit pattern made from photosensitive materials.

RELATED ART STATEMENT

There has known optical encoders which can be divided into two types in view of the movement of an object to be detected, one type being a rotary optical encoder and the other type a linear optical encoder. A rotary optical encoder, as is well known, is constituted so that a rotational slit disk and a fixed slit plate are arranged to face each other, and an LED and a photodiode are also arranged to face each other in a manner between which the rotational silt disk and fixed slit plate are positioned. When a rotational shaft of a motor, for example, is rotated, the rotational slit disk of a rotary encoder mounted on the rotational shaft is also rotated to interrupt intermittently an optical path from the LED through the slits in the fixed slits thereof to the photodiode. Thus, the amount of light received by the photodiode changes periodically as the rotational slit disk rotates, and the output of the photodiode is subject to wave-shaping to obtain rectangular wave pulse signals indicating information on the rotational direction, rotational speed, rotational position and the like.

FIG. 3 shows a halt section of a typical rotational slit disk of a conventional rotary optical encoder. The rotational slit disk 100 has a glass or metal disk body 101, a metal cylindrical part called a hub 102, and a metal fitting 103 for fixing the disk body 101 on the hub 102 so as to rotate integrally. The hub 102 is fixed on the rotational shaft of a motor or the like.

The rotational slit disk is formed thereon with a slit pattern of slits arranged along the circumferential direction of the disk at equal intervals. The slit pattern is formed on the rotational slit disk in the following manner. A shade layer made from photosensitive material is formed on the surface of a transparent glass substrate or a plastic substrate, which in turn is subject to photoetching process to apply a slit pattern thereon. This method of forming the slit pattern is more advantageous in terms of cost and the like than a method of applying a slit pattern in a vapor deposition metal layer such as a chrome layer formed on a glass substrate.

The slit pattern made from photosensitive material, however, is disadvantageous in that it is less strong than a slit pattern of a vapor deposition chrome layer and the like. Accordingly, if the surface of the rotational slit disk touches the surface of the fixed silt plate facing the rotational slit disk owing to an assembly error of the rotational slit disk, run out of the rotational shaft and the like, for example, the silt pattern is damaged, and an accurate detection output cannot be obtained.

SUMMARY

An object of this invention is to provide an optical encoder having a configuration to protect a slit pattern made from photosensitive material.

In an optical encoder according to this invention which has a slit plate constituted in a way that a shade layer made from photosensitive material is formed on the surface of a transparent substrate, and a slit pattern for encoding is formed in the shade layer, the shade layer formed therein with the slit pattern for encoding is overlaid with a transparent protective layer. A transparent protective layer made from acrylic resin, epoxy resin and the like can be employed.

Since in the optical encoder according to this invention the slit pattern made from photosensitive material is covered with the protective layer, the damage to the slit pattern itself and the like can be avoided. As the slit pattern made from photosensitive material is covered with the protective layer and is not exposed, it will not be deteriorated by air. Further, the protective layer is adjusted in its optical properties so that the slit pattern can be made to exhibit desired optical properties. For example, when an anti-reflection coating is used as the protective layer, an optical encoder with high accuracy can be realized.

The optical encoder to which this invention can be applied may be a rotary type in which the slit pattern is formed in a rotational silt disk, or a liner type in which the slit pattern is formed on a slit plate moving reciprocally in a straight line.

On the other hand, in a rotary optical encoder according to this invention which has a rotational slit disk and a shade layer made or photosensitive material, and a slit pattern formed in the shade layer for encoding, the rotational slit disk has an annular projecting surface portion which is formed on an outer periphery of the surface of the rotational slit disk which faces the slit plate.

According to the optical encoder of this invention having the above structure, the projecting surface portion prevents the slit pattern on the surface of the rotational slit disk from being touched by the surface of the fixed slit plate and the like. Accordingly, the slit pattern can be protected securely.

Instead of forming the annular projecting surface portion on the rotational slit disk, a projecting surface portion may be formed on an outer periphery of the surface of the fixed plate which faces the rotational slit disk. Alternatively, an annular projecting surface portion may be formed on the rotational slit disk, together with an annular projecting surface formed on the fixed slit disk so that the both projecting surfaces face each other.

Typically, the rotational slit disk has a disk body formed thereon with the slit pattern for encoding, and a cylindrical hub fixed in the middle of the disk body for fixing the disk body on a rotational shaft. In this case, it is desirable that the disk body and the hub be formed integrally by means of resin material. When the rotational slit disk is a resin integral molding product, it can be manufactured at a lower price than a conventional rotational slit disk whose disk body and hub are manufactured separately. Further, assembling of the disk body and hub can be avoided, and therefore assembly errors can also be avoided.

The projecting surface portion for protecting the slit pattern is also applicable to a linear type optical encoder. That is, in a linear type optical encoder which has a movable slit plate moving in a straight line, a shade layer made of photosensitive material formed on a surface of the movable slit plate, and a slit pattern formed in the shade layer for encoding, a projecting surface portion may be formed on a surface of the movable slit plate where the fixed slit plate faces so that it projects toward the fixed slit plate.

Also in this case, instead of the projecting surface portion on the movable slit plate, a projecting surface portion way be formed on a surface of the fixed slit plate where the movable slit plate faces to that it projects toward the movable slit plate. Alternatively, the movable and fixed slit plates are both formed thereon with projecting surface portions to face each other.

DETAILED DESCRIPTION OF THE PREFERRED EMBODIMENT

An optical encoder according to this invention will now be described with reference to the attached drawings.

Figure 1:
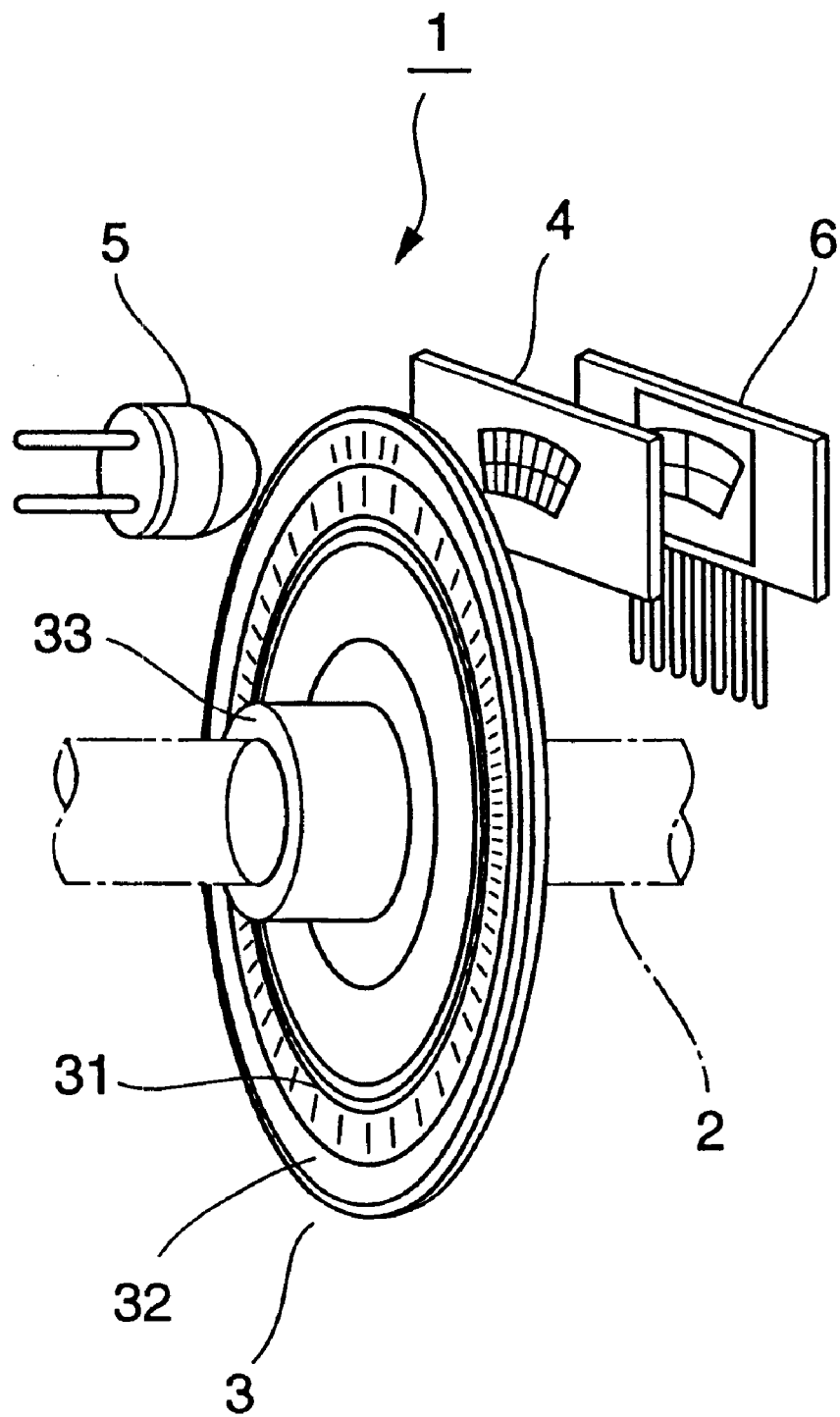
FIG. 1 is an schematic diagram of a reflection type optical encoder according to this invention.

FIG. 1 shows a schematic diagram of a rotary optical encoder to which this invention can be applied. As shown in the drawing, an optical encoder 1 has a rotational slit disk 3 fixed on a rotational shaft 2, a fixed slit plate 4 facing the rotational slit disk 3, and a light-emitting element 5 and a light-receiving element 6 facing each other in a manner that the rotational slit disk 3 and the fixed slit plate 4 are positioned between them.

The rotational slit disk 3 has a disk body 32 on which a line of slits 31 is formed along a circumferential direction, and a cylindrical hub 33 fixed in the center of the disk body 32 for fixing the disk body 32 to the rotational shaft 2. In this example, the transparent disk body 32 and the hub 33 are formed integrally by means of resin material. The fixed silt plate 4 is also a resin molding product.

Figure 2A:
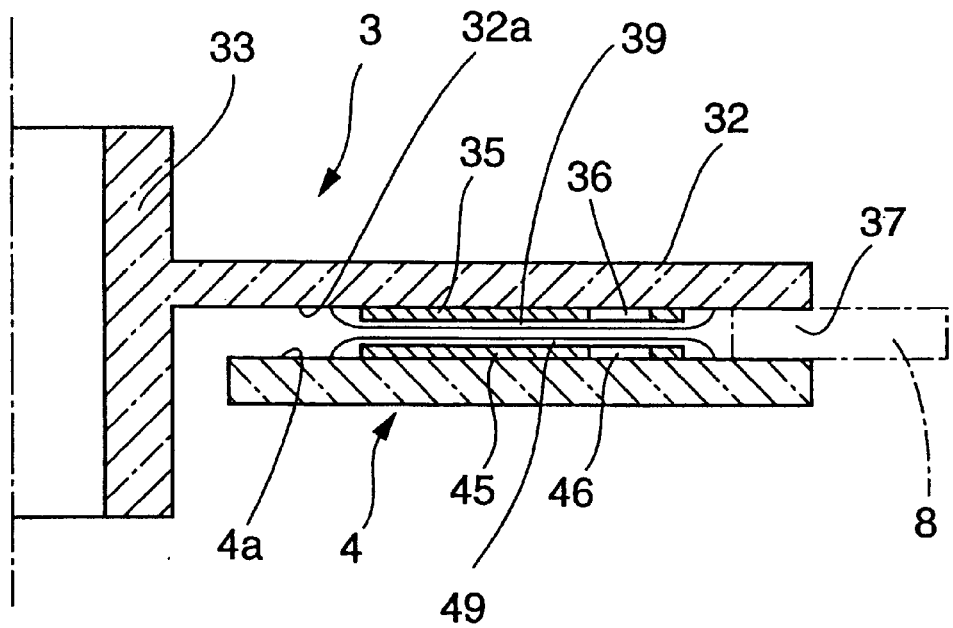
FIG. 2A is a partial sectional view of a rotational slit disk and a fixed slit plate of the optical encoder of FIG. 1.

FIG. 2A shows a half sectional portion of the rotational slit disk 3 and the fixed slit plate 4. As shown here, a shade layer 35 made from photosensitive material is formed on the surface 32a of the disk body 32 of the rotational slit disk 3, and a slit pattern 36 constituting the line of slits 31 is formed on the shade layer 35 by photolithography. The entire shade layer 35 in which the slit pattern 36 is formed is covered with a protective layer 39. The protective layer 39 is made from transparent acrylic resin, epoxy resin, for example, in this example, a shade layer 45 made from photosensitive material is also formed on the surface 4a of the fixed slit plate 4, and a slit pattern 46 is formed in the shade layer 45 by photolithography. The entire shade layer 45 is also covered with a protective layer 49.

The rotational slit disk 3 and the fixed slit plate 4 are held to have a constant cap between them. In order to adjust the gap properly, for example, as shown by imaginary lines in FIG. 2A, a gap-adjusting spacer 8 is inserted between the rotational slit disk 3 and the fixed slit plate 4, and the rotational slit disk 3 is pressed toward the fixed slit plate 4 in an axial direction, to thereby adjust the position of the rotational slit disk 3 and fixed in this state. Thereafter the spacer 8 is removed between the rotational slit disk and the fixed plate.

In the optical encoder 1 of the aforementioned configuration of this example, the slit patterns 36, 46 made from photosensitive material are covered with the protective layers 39, 49. Accordingly, it is possible to prevent the slit patterns 36, 46 from touching other members and being damaged, and the like. Since these slit patterns are covered with the protective layers, the shade layers 35, 45 made from photosensitive materials are not deteriorated by air. In addition, it a protective layer with a certain optical property is employed, the surfaces of the rotational silt disk and the fixed slit plate can be made to exhibit desirable optical properties. For example, the protective layer way be an anti-reflection coating.

The optical encoder 1 of this example has the following effects as well as the above-mentioned effects. As the rotational slit disk 3 is a resin molding product, the optical encoder can be manufactured at a lower price than a conventional optical encoder whose disk body and hub are manufactured separately. Since assembling of the disk body and hub is not required, it is possible to avoid assembly errors. When the sift patterns are transferred to the surface of the rotational slit disk 3 by photolithography, the rotational slit disk material with which the hub is formed integrally can be positioned making use of the center hole of the hub. Accordingly, the rotational slit disk can be positioned with ease when the slit patterns are formed, and at the same time the slit patterns can be formed with accuracy.

Incidentally, although the slit patterns made from photosensitive material are formed on both the rotational slit disk and the fixed slit plate in the above example, the slit pattern made from photosensitive materials may be formed only on the rotational slit disk.

Modified Example of the Rotational Disk and the Fixed Slit Plate

Figure 2B:
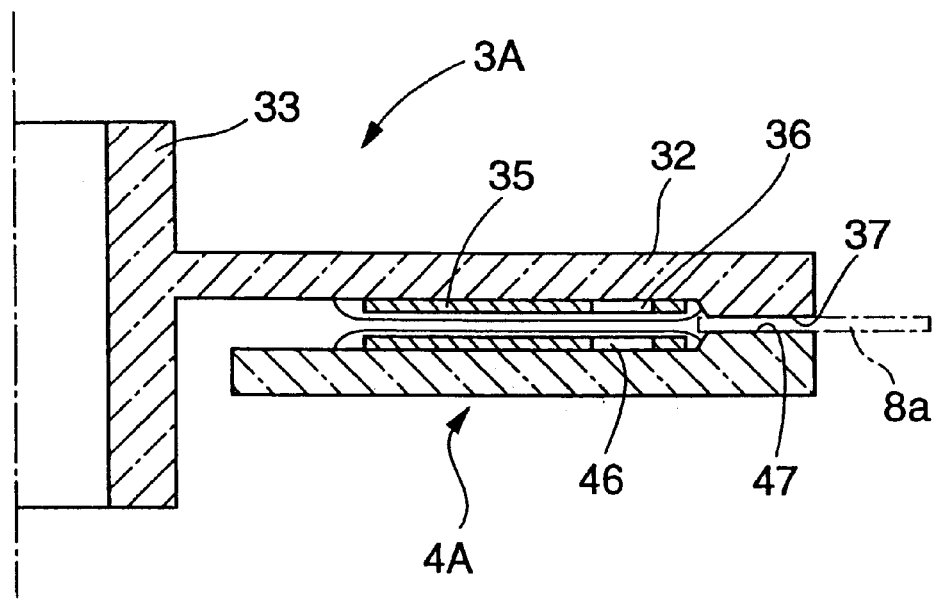
FIG. 2B is a partial sectional view of a modified example of a rotational slit disk and a fixed slit plate.
Figure 3:
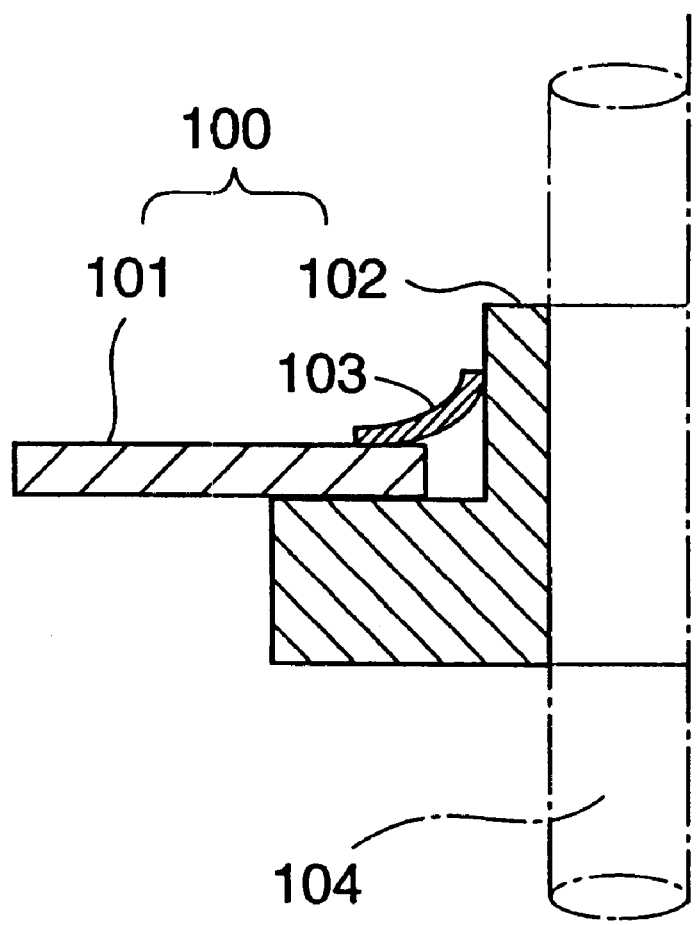
FIG. 3 is a partial sectional view showing the configuration of a conventional rotational slit disk.

FIG. 2B shows a modified example of the aforementioned rotational slit disk 3 and the fixed slit plate 4. In this example shown here, instead of the above protective layers 39, 49, a flat projecting surface portion is formed on an outer peripheral portion of the rotational slit disk and the corresponding surface of the fixed slit plate.

More specifically, as shown in FIG. 2B, an annular projecting surface portion 37 which projects toward a fixed slit plate 4A by certain thickness is formed at the outer peripheral edge of a disk body 32 of a rotational slit disk 3A. A slit pattern 36 is formed on the surface of the disk inside the annular projecting surface portion 37. Similarly, a projecting surface portion 47 which projects toward the annular projecting surface 37 of the rotational slit disk by a prescribed amount is formed on the fixed slit plate 4A. The slit pattern 46 is formed inside the projecting surface portion 47.

The rotational slit disk 3A and the fixed slit plate 4A are positioned so as to face each other with a constant gap between them. For example, the rotational slit disk 3A and the fixed slit plate 4A are held so that the gap between the portion where the slit pattern 36 is formed and the portion where the slit pattern 46 is formed may be about 0.1 mm, and the gap between the projecting surface 37 and the projecting surface 47 on the outer periphery may be about 0.05 mm.

In order to adjust the gap, for example, as shown by imaginary lines in FIG. 2B, a gap-adjusting spacer 8a is inserted between the rotational slit disk 3 and the fixed slit plate 4, and the rotational slit disk 3 is pressed toward the fixed slit plate 4 in an axial direction, and then the rotational silt disk 3 is positioned and fixed. Thereafter the spacer 8a is removed.

Since the other components are identical to the corresponding parts in the optical encoder 1 of FIG. 1, explanation thereof will be omitted here in this specification.

In the optical encoder having the above-mentioned rotational slit disk and fixed slit plate, the spacer inserted between the projecting surfaces 37, 47 formed on the rotational slit disk 3A and the fixed slit plate 4A can easily adjust the gap between the two members. Even when the rotational slit disk 3 rotates eccentrically, the projecting surfaces 37, 47 comes in contact with each other to prevent the sift patterns 36, 46 from contacting with each other. Accordingly, these projecting surfaces 37, 47 function as a protection of the slit patterns made from photosensitive material. Since the slit patterns made from photosensitive materials have less strength than a conventional slit pattern consisting of a vapor deposition chrome layer and the like, forming such a protection is extremely advantageous.

Incidentally, in the above example, the slit patterns made from photosensitive material are formed on both the rotational slit disk and the fixed slit plate. The slit pattern of photosensitive material may be formed only on the rotational slit disk, while the slit pattern on the fixed slit plate say be formed from shade material in which light transmitting slits are formed.

Other Example

The aforementioned explanation is on the rotary optical encoder according to this invention. This invention, however, can also be applied to a linear optical encoder.

In the ease of a linear optical encoder having a movable slit plate which moves in a straight line, a shade layer made of photosensitive material which is formed on the movable slit, and a slit pattern formed in the shade layer for encoding, a projecting surface which projects toward the fixed slit plate may be formed on the surface facing the fixed slit plate of the movable slit plate.

Instead of forming the projecting surface on the movable slit plate. It is possible to fore a projecting surface which projects toward the movable slit plate on the surface facing the movable slit plate on the side of the fixed slit plate. It is also possible to form projecting surfaces on both the movable slit plate and the fixed slit plate, and to make them face each other.

As was described above, in the optical encoder according to this invention, the shade layer in which the slit pattern for encoding is formed is protected by the transparent protective layer. Accordingly, the damage to the slit patterns themselves and the like can be avoided. As the slit patterns made from photosensitive material are covered with the protective layer and are not exposed, they will not be deteriorated by air. Further, if the protective layer is given an optical property, the optical property of the slit patterns can be made appropriate.

Furthermore, in the optical encoder according to this invention, the projecting surface which projects toward the fixed slit plate is formed on the rotational slit disk or the movable slit plate so that the slit patterns made from photosensitive material formed on the rotational slit disk or the movable slit plate may be prevented from being touched by other members. As a result, the damage to the slit patterns which do not have enough strength and the like can be avoided.

I claim:

1. A rotary optical encoder comprising a rotational slit disk, a shade layer made from photosensitive material which is formed on the rotational slit disk, a slit pattern formed in the shade layer for encoding, wherein the rotational slit disk is formed with an annular projecting surface which is positioned on an outer peripheral portion thereof where a fixed slit plate faces and projects toward the fixed slit plate.

2. An optical encoder according to claim 1, wherein said fixed slit plate has a projecting surface which projects toward the rotational slit disk and which is positioned on a surface portion of the fixed slit plate where said annular projecting surface of the rotational slit disk faces.

3. An optical encoder according to claim 1, wherein said rotational slit disk has a disk body in which said slit pattern for encoding is formed, and a cylindrical hub fixed in the middle of the disk body for fixing the disk body on a rotational shaft, and wherein the disk body and the hub are formed integrally by means of resin material.

4. A linear optical encoder comprising a movable slit plate moving in a straight line, a shade layer made from photosensitive material which is formed on the movable slit plate, and a slit pattern formed in the shade layer for encoding, wherein the movable slit plate has a projecting surface projecting toward and facing a fixed slit plate.

5. An optical encoder according to claim 4, wherein said fixed slit plate has, on a surface thereof facing said projecting surface of the movable slit plate, a projecting surface which projects toward the movable slit plate.

6. A rotary optical encoder comprising a rotational slit disk, a shade layer made from photosensitive material which is formed on the rotational slit disk, a slit pattern formed in the shade layer for encoding, and a fixed slit plate, wherein the fixed slit plate is formed with an annular projecting surface which is positioned where the rotational slit disk faces and projects toward the rotational slit disk.

7. A linear optical encoder having a movable slit plate moving in a straight line, a shade layer made from photosensitive material which is formed on the movable slit plate, and a slit pattern formed in the shade layer for encoding, wherein the fixed slit plate has a projecting surface projecting toward and facing the movable slit plate.

* * * * *